United States Patent
Demski et al.

(10) Patent No.: US 10,361,554 B1
(45) Date of Patent: Jul. 23, 2019

(54) TECHNIQUES FOR DETERMINING INDUCTANCES

(71) Applicant: Altera Corporation, San Jose, CA (US)

(72) Inventors: Jeffrey Demski, Orefield, PA (US); Douglas Lopata, Boyertown, PA (US); Ashraf Lotfi, Bridgewater, NJ (US)

(73) Assignee: Altera Corporation, San Jose, CA (US)

( * ) Notice: Subject to any disclaimer, the term of this patent is extended or adjusted under 35 U.S.C. 154(b) by 308 days.

(21) Appl. No.: 15/278,013

(22) Filed: Sep. 27, 2016

(51) Int. Cl.
*H02H 7/12* (2006.01)
*G01R 27/26* (2006.01)

(52) U.S. Cl.
CPC .......... *H02H 7/12* (2013.01); *G01R 27/2611* (2013.01)

(58) Field of Classification Search
CPC .............................. H02H 7/12; G01R 27/2611
USPC .......................................................... 361/18
See application file for complete search history.

(56) References Cited

U.S. PATENT DOCUMENTS

| | | | | |
|---|---|---|---|---|
| 4,426,690 A | * | 1/1984 | Motoyama | G11B 7/085 250/201.5 |
| 5,066,914 A | * | 11/1991 | Vavrek | G01R 33/3852 324/309 |
| 2007/0103122 A1 | * | 5/2007 | Morong | G05F 1/46 323/205 |
| 2008/0246456 A1 | * | 10/2008 | Djenguerian | G05F 1/66 323/302 |
| 2015/0280558 A1 | | 10/2015 | Lopata et al. | |
| 2015/0381045 A1 | * | 12/2015 | Chen | H02M 3/156 323/271 |
| 2017/0370977 A1 | * | 12/2017 | El-Barbari | G01R 27/2611 |
| 2018/0174786 A1 | * | 6/2018 | Matsuo | H01F 7/1811 |

* cited by examiner

*Primary Examiner* — Kevin J Comber
(74) *Attorney, Agent, or Firm* — Steven J. Cahill (57) ABSTRACT

A circuit system includes a current sensor circuit, a subtractor circuit, a multiplier circuit, and a divider circuit. The current sensor circuit generates a current sense signal that indicates a current through an inductor. The circuit system generates a current value based on the current sense signal. The subtractor circuit determines a voltage difference across the inductor. The multiplier circuit multiplies the voltage difference by a time period that the voltage difference is applied across the inductor to generate a product. The divider circuit divides the product by the current value to generate an estimated inductance of the inductor.

20 Claims, 4 Drawing Sheets

TECHNIQUES FOR DETERMINING INDUCTANCES

FIELD OF THE DISCLOSURE

The present disclosure relates to electronic circuits, and more particularly, to circuits and methods that determine inductances of inductors.

BACKGROUND

A power converter is a circuit that converts an input voltage into an output voltage. A power converter may generate a regulated output voltage at an output node that is coupled to a load. A power converter typically provides output current to the load at the regulated output voltage, and the load draws current from the power converter. A power converter may have a controller that manages the operation of the power converter by controlling the conduction periods of switching transistors therein. Typically, the controller measures the output voltage and based on the output voltage modifies duty cycles of the switching transistors.

BRIEF SUMMARY

According to some embodiments, a circuit system includes a current sensor circuit, a subtractor circuit, a multiplier circuit, and a divider circuit. The current sensor circuit generates a current sense signal that indicates a current through an inductor. The circuit system generates a current value based on the current sense signal. The subtractor circuit determines a voltage difference across the inductor. The multiplier circuit multiplies the voltage difference by a time period that the voltage difference is applied across the inductor to generate a product. The divider circuit divides the product by the current value to generate an estimated inductance of the inductor.

Embodiments of the present invention can be implemented in numerous ways, such as a process, an apparatus, a system, or a device. Various objects, features, and advantages of the present invention will become apparent upon consideration of the following detailed description and the accompanying drawings.

DETAILED DESCRIPTION

As discussed above, a power converter provides output current to a load at a regulated output voltage using switches, such as switching transistors. A power converter may also have an output filter that includes an inductor and a capacitor. In response to the current drawn by the load from a power converter increasing, the power converter increases the output current provided to the load to maintain the output voltage at a substantially constant voltage. If the current drawn by the load increases substantially in a short time period, the power converter may cause the output current to increase to the maximum output current of the power converter. Power converters typically have maximum allowed output currents. The maximum output current of a power converter may be selected, for example, to prevent the inductor in the output filter from saturating. When the inductor in the output filter saturates, the inductor may experience non-linearity, which is undesirable. In many power converters, it may be advantageous to determine the inductance of the inductor in the output filter in order to prevent the inductor from saturating or to detect a failure in the inductor. It may also be advantageous to be able to determine the inductance of the inductor in the output filter in order to adjust a compensation network in a feedback loop circuit in the power converter.

According to some embodiments, a system for determining an estimated inductance of an inductor in an apparatus, such as a power converter circuit, includes a current sensor circuit, a subtractor circuit, a multiplier circuit, and a divider circuit. The current sensor circuit senses a current through the inductor over a period of time. The subtractor circuit determines the voltage across the inductor. The multiplier circuit multiplies the voltage across the inductor by a period of time that the voltage is applied to the inductor. The divider circuit divides the output of the multiplier circuit by a current value derived from the output of the current sensor circuit to generate an estimate of the inductance of the inductor. The estimated inductance of the inductor may be used, for example, to adjust a current limit of a power converter circuit, to adjust a compensation network in a power converter circuit, or to detect a failure in the inductor.

Figure 1:
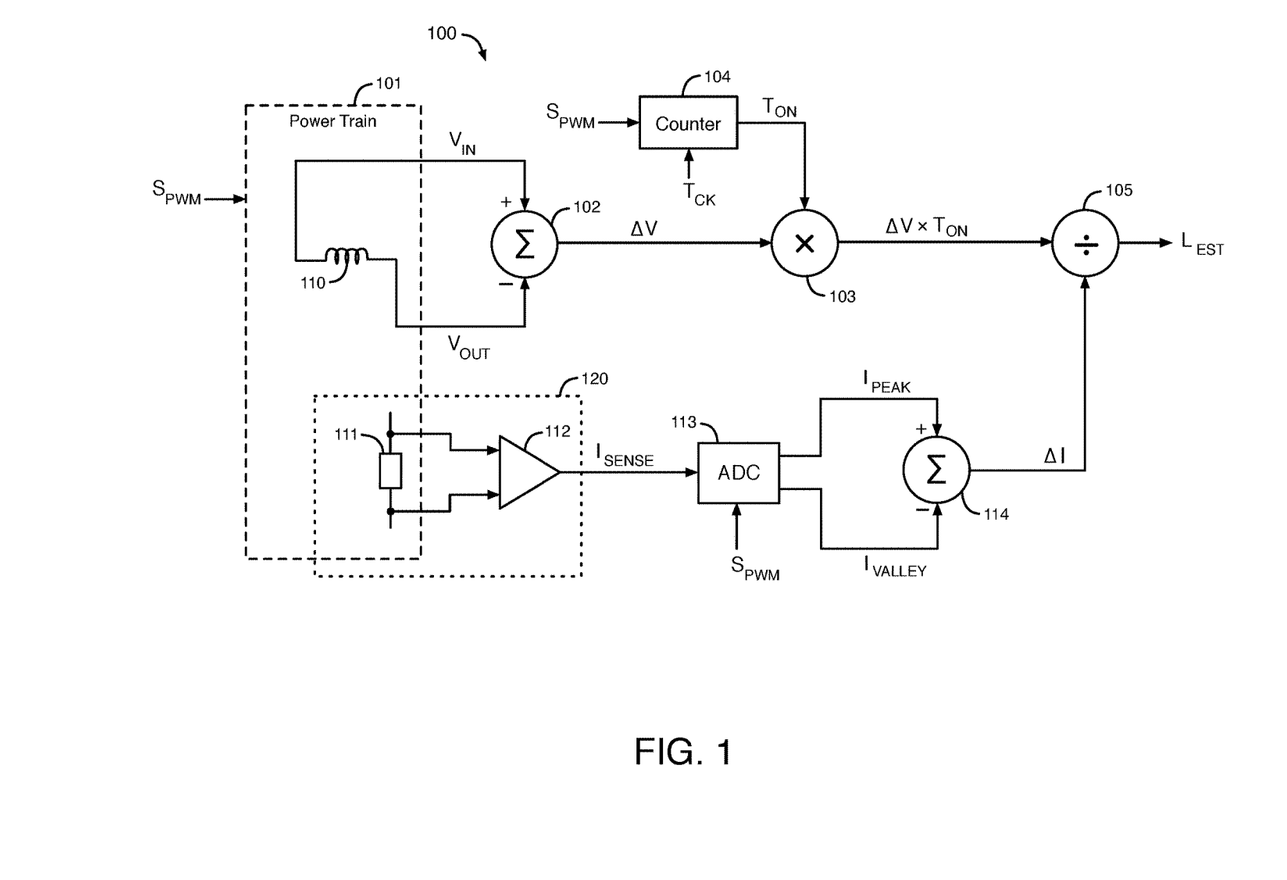
FIG. 1 illustrates an example of a circuit system that determines an estimated inductance of an inductor in an apparatus, according to an embodiment.

FIG. 1 illustrates an example of a circuit system 100 that determines an estimated inductance of an inductor in an apparatus, according to an embodiment. Circuit system 100 includes a power train circuit 101, a subtractor circuit 102, a multiplier circuit 103, a counter circuit 104, a divider circuit 105, an amplifier circuit 112, an analog-to-digital converter circuit 113, and a subtractor circuit 114. The circuit system 100 may be provided in one or more integrated circuits and one or more discrete circuit components. In an embodiment, circuits 102-105 and circuits 112-114 may be in a single integrated circuit.

Circuit system 100 may include, for example, a power converter circuit. The power train circuit 101 and any of the other circuits shown in FIG. 1 may be part of the power converter circuit. A power converter circuit may also be referred to as a voltage regulator circuit or a DC/DC (direct-current to direct-current) converter circuit.

In the embodiment of Figure (FIG. 1, power train circuit 101 includes an inductor 110 and a sense element 111. Sense element 111 may be, for example, a passive resistor or an active field-effect transistor device. Power train circuit 101 may also include one or more switches (not shown) that may be, for example, switching transistors. When at least one of the switches in power train circuit 101 is on, current flows through the inductor 110, and an output voltage $V_{OUT}$ of the power train circuit 101 is generated from a first terminal of inductor 110. An input voltage $V_{IN}$ to the power train circuit 101 is applied to a second terminal of inductor 110, for example, when one of the switches in power train circuit 101 is on.

As an example, if circuit system 100 is a step-down switching DC/DC converter, the main switch (not shown) in circuit 101 may be coupled between the second terminal of inductor 110 and a node at $V_{IN}$, and input voltage $V_{IN}$ may be applied to inductor 110 through the main switch when the main switch is on. As another example, if circuit system 100 is a step-up switching DC/DC converter, the main switch in circuit 101 may be coupled between the first terminal of inductor 110 and a node at a ground voltage, and the node at $V_{IN}$ may be coupled to the second terminal of inductor 110.

The inductance L of an inductor can be calculated using one or more of equations (1)-(4) below, where I is the current through the inductor, V is the voltage across the inductor, $T_{ON}$ is the on time of at least one of the switches in the power train circuit 101 in each switching cycle, and $T_{OFF}$ is the off time of that switch in each switching cycle.

$$L \times dI/dt = dV \quad (1)$$

$$I_{PEAK} - I_{VALLEY} = dI = T_{ON} \times (V_{IN} - V_{OUT})/L = T_{ON} \times dV/L \quad (2)$$

$$L = [T_{ON} \times dV]/dI \quad (3)$$

$$L = -[T_{OFF} \times V_{OUT}]/dI \quad (4)$$

The circuit system 100 of FIG. 1 implements equations (1)-(3) above to determine an estimate of the inductance $L_{EST}$ of inductor 110. Subtractor circuit 102 subtracts the input voltage $V_{IN}$ from the output voltage $V_{OUT}$ to generate one or more output signals that indicate the voltage $\Delta V$ across the inductor 110 (i.e., $V_{IN} - V_{OUT} = \Delta V$). Subtractor circuit 102 may be an analog or digital subtractor circuit. The voltage $\Delta V$ across the inductor 110 may be provided from the output of subtractor circuit 102 to multiplier circuit 103 as an analog signal or as one or more digital signals.

A pulse-width modulation (PWM) signal $S_{PWM}$ that is used to control the switching frequency of the one or more switches in power train circuit 101 is provided to an input of counter circuit 104. Signal $S_{PWM}$ indicates the switching frequency of the one or more switches in circuit 101. A periodic clock signal $T_{CK}$ is provided to another input of counter circuit 104. $T_{ON}$ is the on time of at least one of the switches in power train circuit 101 during which the voltage $V_{IN} - V_{OUT} = \Delta V$ is applied across the inductor 110. Thus, $T_{ON}$ is the time period in each switching cycle of the switch or switches in the power train circuit 101 that the voltage $V_{IN} - V_{OUT}$ is applied across the inductor 110. Counter circuit 104 determines the on time $T_{ON}$ based on the PWM signal $S_{PWM}$. Flip-flops in counter circuit 104 are clocked by clock signal $T_{CK}$. Counter circuit 104 generates one or more output signals that indicate the on time $T_{ON}$. The on time $T_{ON}$ may be provided from the output of counter circuit 104 to multiplier circuit 103 as, for example, an analog signal or as one or more digital signals.

Multiplier circuit 103 multiplies the voltage $\Delta V$ across the inductor 110 as received from subtractor circuit 102 by the on time $T_{ON}$ as received from the counter circuit 104 to generate a product $\Delta V \times T_{ON}$. Multiplier circuit 103 generates one or more output signals that indicate the product $\Delta V \times T_{ON}$ of the multiplication. Multiplier circuit 103 may generate the product $\Delta V \times T_{ON}$ of the multiplication, for example, as an analog signal or as one or more digital signals. Multiplier circuit 103 may be implemented as an analog or digital multiplier circuit. Multiplier circuit 103 may include one or more analog-to-digital converters or one or more digital-to-analog converters to convert the signals that indicate $\Delta V$ and $T_{ON}$ to digital or analog as appropriate to perform the multiplication and to generate the one or more output signals that indicate the product of the multiplication. The one or more output signals that indicate the product $\Delta V \times T_{ON}$ of the multiplication are provided to divider circuit 105.

The circuit system 100 of FIG. 1 has a current sensor circuit 120 that includes sense element 111 and amplifier circuit 112. The current sensor circuit 120 determines the current through the inductor 110 to generate an analog current sense signal $I_{SENSE}$. The current sense signal $I_{SENSE}$ indicates the current through the inductor 110. As an example, some or all of the inductor current may be provided through the sense element 111, and the amplifier circuit 112 may amplify a voltage across the sense element 111 to generate the current sense signal $I_{SENSE}$ as a voltage replicated inductor current. The current sensor circuit 120 may be implemented, for example, using one of the integrated current replicators shown in FIG. 2, 3, or 5 of commonly-assigned U.S. patent application publication 20150280558, filed Mar. 27, 2014, which is incorporated by reference herein in its entirety. The current sensor circuit 120 may generate a current sense signal $I_{SENSE}$ that fully replicates the time domain inductor waveform in all conditions that the circuit system 100 operates in (e.g., tristate, diode emulation, and normal operation). The current sensor circuit 120 may cause the current sense signal $I_{SENSE}$ to indicate the continuous current through the inductor 110 (i.e., the entire inductor current waveform, as opposed to just the rising or falling inductor current). The current sense signal $I_{SENSE}$ can either be a current or converted to a voltage.

The current sense signal $I_{SENSE}$ is provided to analog-to-digital converter (ADC) circuit 113. ADC circuit 113 converts the analog current sense signal $I_{SENSE}$ into digital output signals $I_{PEAK}$ and $I_{VALLEY}$ in response to PWM signal $S_{PWM}$. $I_{PEAK}$ indicates the maximum instantaneous current through inductor 110, and $I_{VALLEY}$ indicates the minimum instantaneous current through inductor 110. ADC circuit 113 uses the period of the switching cycle as indicated by PWM signal $S_{PWM}$ to determine the maximum instantaneous current in $I_{PEAK}$ and the minimum instantaneous current in $I_{VALLEY}$. Each of signals $I_{PEAK}$ and $I_{VALLEY}$ may include one or more digital signals. Signals $I_{PEAK}$ and $I_{VALLEY}$ are provided to subtractor circuit 114.

Subtractor circuit 114 subtracts the maximum instantaneous current through inductor 110 as indicated by $I_{PEAK}$ from the minimum instantaneous current through inductor 110 as indicated by $I_{VALLEY}$ to generate a current difference $\Delta I$ that is indicated by one or more output signals. Subtractor circuit 114 may be an analog or digital subtractor circuit. The current difference $\Delta I$ may be provided from subtractor circuit 114 to divider circuit 105 as an analog signal or as one or more digital signals. Thus, circuits 113-114 generate a current value $\Delta I$ that equals a change in the current through inductor 110 over a period of time, i.e., dI from equation (3). Circuits 113-114 generate the current value $\Delta I$ based on the current sense signal $I_{SENSE}$.

In an alternative embodiment, circuit system 100 may determine an average current through the inductor 110 using current sense signal $I_{SENSE}$, instead of calculating the difference between the maximum and minimum instantaneous currents through inductor 110. In this embodiment, the $\Delta I$ provided to divider circuit 105 indicates the average current through inductor 110. As an example, circuit system 100 may measure values of the inductor current using $I_{SENSE}$ at half-way points between the maximum and minimum instantaneous currents through inductor 110 to generate an estimate of the average current through inductor 110.

Divider circuit 105 divides the multiplication product $\Delta V \times T_{ON}$ by the current difference $\Delta I$ to generate an estimate $L_{EST}$ of the inductance of inductor 110. Thus, divider circuit 105 performs the division shown in equation (3) above, where ΔV is used as dV, and ΔI is used as dI. Divider circuit 105 may be an analog or digital divider circuit. The estimated inductance $L_{EST}$ generated by divider circuit 105 may be an analog signal or one or more digital signals. The estimated inductance $L_{EST}$ generated by divider circuit 105 may be a real-time measurement of the inductance of inductor 110 in each switching cycle of the one or more switches or in some other repeating interval of time (e.g., every N number of switching cycles, where N is a positive integer). Circuit system 100 can automatically generate an estimate $L_{EST}$ of the inductance of inductor 110 without input from a user, which eliminates user measurements and user errors.

Figure 2:
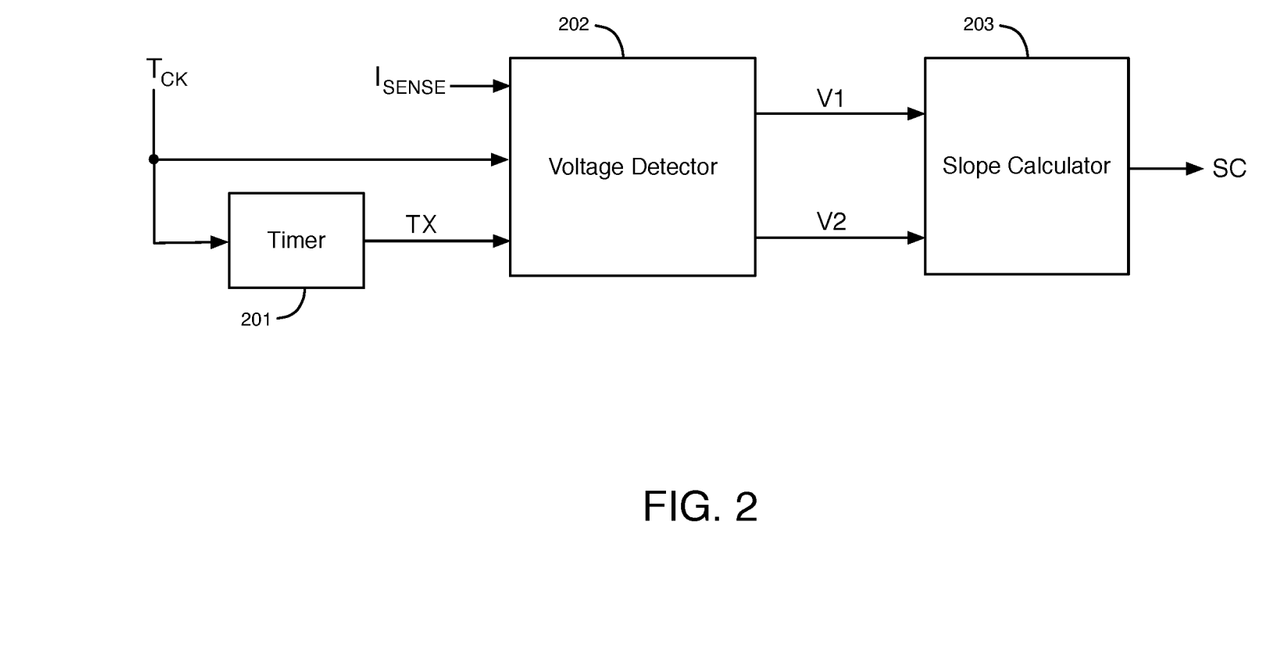
FIG. 2 illustrates an example of circuitry that can generate an output for controlling various parameters in a power converter circuit, according to an embodiment.

FIG. 2 illustrates an example of circuitry that can generate an output for controlling various parameters in an apparatus, such as a power converter circuit, according to an embodiment. The circuitry of FIG. 2 includes a timer circuit 201, a voltage detector circuit 202, and a slope calculator circuit 203.

As shown in FIG. 2, the periodic clock signal $T_{CK}$ is provided to inputs of timer circuit 201 and voltage detector circuit 202. Timer circuit 201 generates a timing signal TX based on the frequency of operation as indicated by the frequency of clock signal $T_{CK}$. Timing signal TX is provided to an input of voltage detector circuit 202.

The current sense signal $I_{SENSE}$ generated by the current sensor circuit 120 disclosed with respect to FIG. 1 is provided to another input of voltage detector circuit 202. The current sense signal $I_{SENSE}$ may be, for example, a voltage replicated indication of the inductor current. Voltage detector circuit 202 generates inductor current replicated voltages V1 and V2 at two different times T0 and T1, respectively, based on the current sense signal $I_{SENSE}$. Times T0 and T1 are determined by the clock signal $T_{CK}$ and the timing signal TX, respectively. Voltage detector circuit 202 generates a first inductor current replicated voltage V1 at a time T0 that is indicated by the clock signal $T_{CK}$. The first inductor current replicated voltage V1 may be on the positive or negative slope of the inductor current or voltage. Voltage detector circuit 202 then generates a second inductor current replicated voltage V2 at a time T1 after time T0 that is indicated by timing signal TX. As an example, voltage detector circuit 202 may cause V1 to equal the maximum inductor current replicated voltage indicated by signal $I_{SENSE}$ and V2 to equal the minimum inductor current replicated voltage indicated by signal $I_{SENSE}$.

Voltages V1 and V2 are provided to inputs of slope calculator circuit 203. Slope calculator circuit 203 calculates the slope of the first and second inductor current replicated voltages V1 and V2 and outputs the slope calculation SC. Slope calculator circuit 203 may be, for example, an analog-to-digital converter (ADC) circuit that converts the difference between the first and second current replicated voltages V1 and V2 into a digital output SC. As other examples, the slope calculator circuit 203 may be an analog voltage detector or a peak voltage detector that generates an analog output SC indicating a slope of the input voltages V1 and V2.

In an embodiment, the output SC of the slope calculator circuit 203 may be used to calculate the estimated inductance $L_{EST}$ of an inductor in the power converter circuit, such as inductor 110, using for example, one or more of equations (1)-(4) above. The output SC of circuit 203 may be used as an indication of the change in the inductor current ΔI (or dI) over time in equation (3) or (4) above. In this embodiment, the circuits 201-203 of FIG. 2 replace the circuits 113-114 that are used in circuit system 100 to generate the change in the inductor current ΔI.

In other embodiments, the output SC of the slope calculator circuit 203 may be used, for example, to control a current limit of the inductor current in the power converter circuit or the stability of the power converter circuit. These embodiments are described in further detail below with respect to FIG. 3.

Knowing the inductance value of an inductor in real-time may be of critical importance, because important adjustments to a circuit system can be made automatically in response to the inductance changing. For example, as the inductance changes versus temperature, an over current threshold value in a power converter circuit can be automatically adjusted to compensate for the changing inductance. As another example, the control loop of a power converter circuit can be optimized by automatically varying the compensation values versus temperature in response to changes in the inductance.

Figure 3:
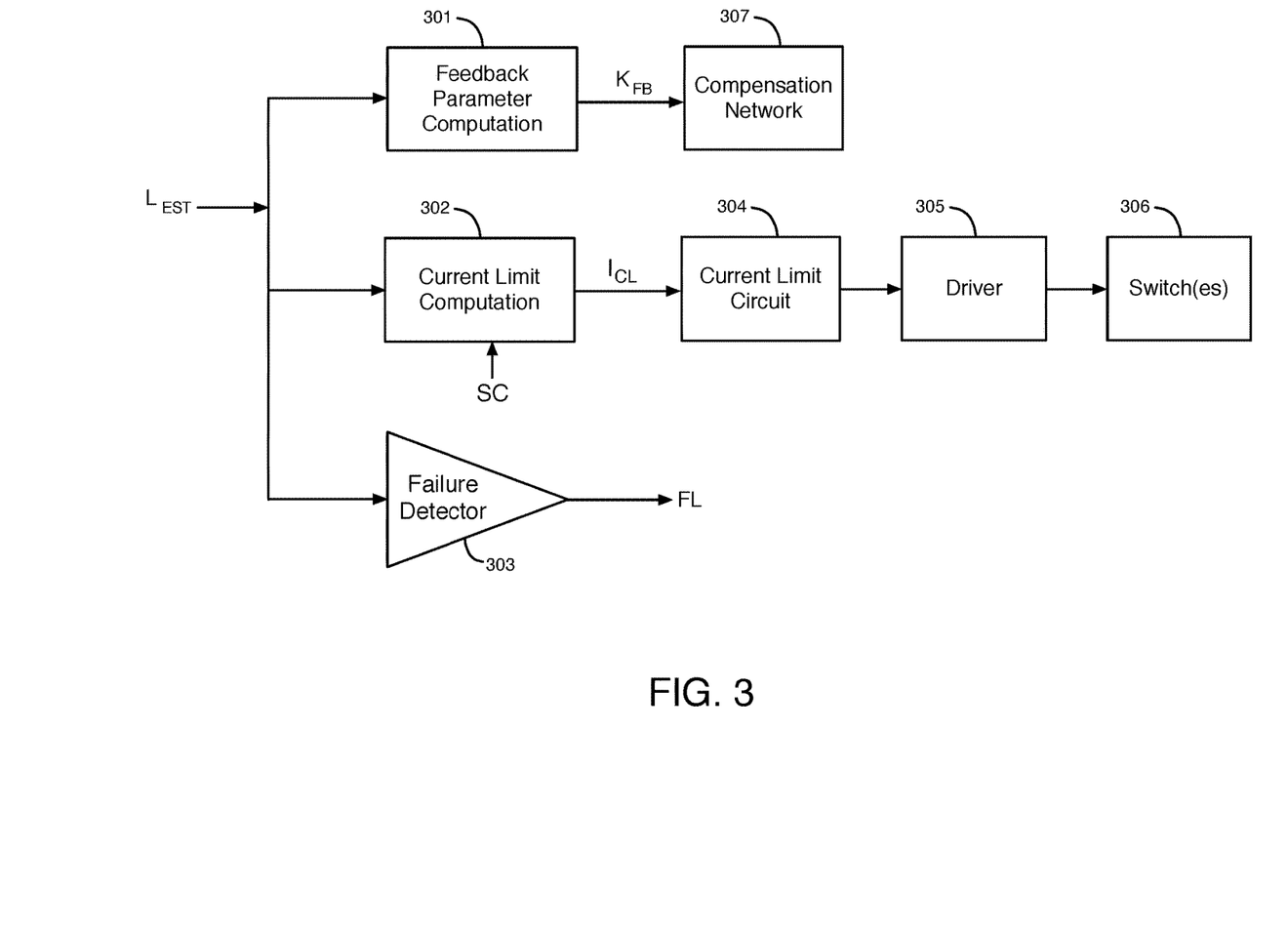
FIG. 3 illustrates examples of techniques for using the estimated inductance of an inductor to provide adjustments in a circuit system, according to an embodiment.

FIG. 3 illustrates examples of techniques for using the estimated inductance of an inductor to provide adjustments in a circuit system, according to an embodiment. FIG. 3 shows a feedback parameter computation block 301, a current limit computation block 302, a failure detector block 303, a current limit circuit 304, a driver circuit 305, one or more switches 306, and a compensation network 307. Each of the three blocks 301-303 may be implemented by programmable circuitry, non-programmable circuitry, software, or a combination thereof.

As shown in FIG. 3, the estimated inductance $L_{EST}$ is provided to feedback parameter computation block 301. The estimated inductance $L_{EST}$ provided to block 301 may be the output of divider circuit 105 of FIG. 1, or alternatively, may be generated based on the output SC of slope calculator circuit 203 of FIG. 2. A power converter circuit, such as circuit system 100, may have a compensation network 307 coupled to a feedback loop that controls the switching of the one or more switches in power train 101. The compensation network 307 in the feedback loop may include one or more resistors and/or one or more capacitors. The feedback parameter computation block 301 determines changes to the compensation network 307 based on changes in the estimated inductance $L_{EST}$ of the inductor 110 to optimize the feedback loop in the power converter circuit.

For example, the feedback parameter computation block 301 may determine an adjustment to the resistance and/or the capacitance of the compensation network 307 in the feedback loop in a power converter circuit based on a change in the estimated inductance $L_{EST}$ of the inductor 110. The feedback parameter computation block 301 may generate signals $K_{FB}$ that indicate the adjustment to be made to the compensation network 307 of the power converter circuit based on a change in the estimated inductance $L_{EST}$. Signals $K_{FB}$ are provided to the compensation network 307. The compensation network 307 may, for example, open or close one or more switches coupled to the resistors and/or capacitors to adjust the resistance and/or capacitance of the compensation network 307 in response to changes in signals $K_{FB}$ that block 301 generates based on changes in the estimated inductance $L_{EST}$.

Typically, a current limit threshold in a power converter circuit is set to an over current threshold fault that corresponds to the safest value of the silicon and the system. The current limit threshold can also be set to prevent inductor saturation or to limit the saturation to a safe amount. Individual variation between circuit boards and inductance dependence on temperature are compensated for by using the most conservative current limit threshold. Thus, the current limit threshold in a power converter circuit is typically fixed at a low value.

However, any substantial change in the current through an inductor may be a direct indication of the inductor saturation entering into its non-linear region. The circuit system 100 of FIG. 1 monitors the rate of change of the current through the inductor 110 (i.e., dI/dt) to produce an estimated inductance value $L_{EST}$ that can be used as a real-time protection against overloading conditions that could be caused by a substantial decrease in the inductance of the inductor 110, as described below.

In the embodiment of FIG. 3, the estimated inductance $L_{EST}$ is also provided to a current limit computation block 302. The estimated inductance $L_{EST}$ provided to block 302 may be the output of divider circuit 105 of FIG. 1, or alternatively, may be generated based on the output SC of slope calculator circuit 203 of FIG. 2. The current limit computation block 302 determines a current limit threshold that indicates a current overload condition for the power converter circuit (e.g., system 100) based on the estimated inductance $L_{EST}$. The current limit threshold generated by block 302 is provided to current limit circuit 304 in the power converter circuit as signal $I_{CL}$. The current limit circuit 304 may be, for example, a comparator circuit that compares the current through the inductor 110 to the current limit threshold indicated by signal $I_{CL}$. When current limit circuit 304 determines that the current through inductor 110 reaches or exceeds the current limit threshold indicated by signal $I_{CL}$, current limit circuit 304 causes driver circuit 305 to turn off a switch (or switches) 306 in power train circuit 101 to reduce the current through inductor 110.

Current limit computation block 302 can determine when inductor 110 is going into saturation (either soft or hard saturation) based on the estimated inductance $L_{EST}$ generated by divider circuit 105 or the circuitry of FIG. 2. Current limit computation block 302 can make an appropriate adjustment to the current limit threshold by changing signal $I_{CL}$ in response to a change in the estimated inductance $L_{EST}$ that indicates that inductor 110 is saturating. For example, current limit computation block 302 may cause the current limit threshold indicated by signal $I_{CL}$ to increase in response to the estimated inductance $L_{EST}$ of the inductor 110 decreasing in saturation. In some embodiments, the current limit computation block 302 may cause the current limit threshold indicated by signal $I_{CL}$ to decrease in response to the estimated inductance $L_{EST}$ of the inductor 110 increasing.

As a specific example, current limit computation block 302 may adjust the current limit threshold indicated by signal $I_{CL}$ based on any change in the estimated inductance $L_{EST}$ of inductor 110 that is outside a predefined expected range of inductances of inductor 110. As yet another example, current limit computation block 302 may adjust the current limit threshold indicated by signal $I_{CL}$ based on any change in the estimated inductance $L_{EST}$ of inductor 110.

In another embodiment, the output SC of the slope calculator circuit 203 of FIG. 2 is provided directly to current limit computation block 302 as shown in FIG. 3. In this embodiment, current limit computation block 302 uses the output SC of the slope calculator circuit 203 to vary the current limit threshold of the current in inductor 110 as indicated by signal $I_{CL}$. In this embodiment, current limit computation block 302 may control the current limit threshold of the current in inductor 110 using output SC, instead of or in addition to, using the estimated inductance $L_{EST}$.

In the embodiment of FIG. 3, the estimated inductance $L_{EST}$ is also provided to failure detector block 303. The estimated inductance $L_{EST}$ provided to block 303 may be the output of divider circuit 105 of FIG. 1, or alternatively, may be generated based on the output SC of slope calculator circuit 203 of FIG. 2. The failure detector block 303 compares the estimated inductance $L_{EST}$ of the inductor to a predefined expected range of inductance values. If the failure detector block 303 determines that the estimated inductance $L_{EST}$ falls outside the predefined range of inductance values, failure detector block 303 asserts a failure signal FL. The estimated inductance $L_{EST}$ falling outside the predefined range of inductance values may, for example, indicate a short in the inductor 110. In response to the failure signal FL being asserted, circuit system 100 may shut down. For example, circuit system 100 may turn off all of the switches 306 in power train circuit 101 in response to the failure signal FL being asserted.

Figure 4:
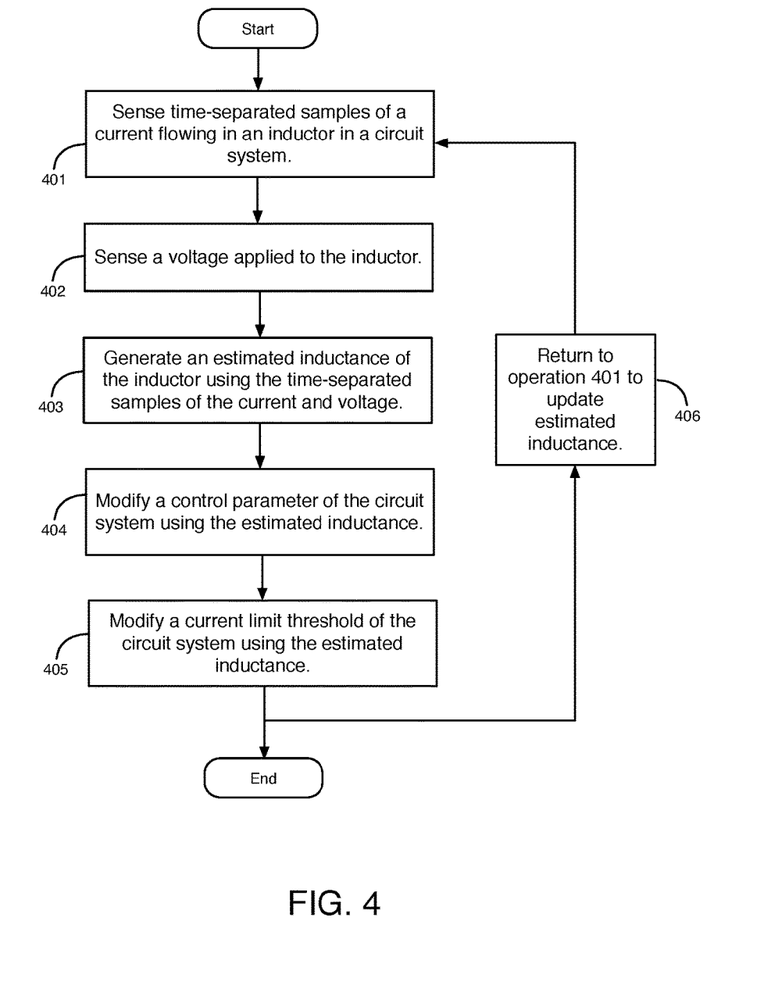
FIG. 4 illustrates examples of operations that may be performed to determine an estimated inductance and to use the estimated inductance to control parameters in a circuit system, according to an embodiment.

FIG. 4 illustrates examples of operations that may be performed to determine an estimated inductance and to use the estimated inductance to control parameters in a circuit system, according to an embodiment. The operations of FIG. 4 start with operation 401. In operation 401, a circuit system senses time-separated samples of a current flowing through an inductor in the circuit system. Operation 401 may be performed, for example, by the current sensor circuit 120 of FIG. 1 to sense time-separated samples of the current flowing through inductor 110. In operation 402, the circuit system senses a voltage applied to the inductor. Operation 402 may be performed, for example, by subtractor circuit 102 of FIG. 1 to sense a voltage applied to inductor 110 to generate ΔV, as described above.

In operation 403, the circuit system generates an estimated inductance of the inductor using the time-separated samples of the current and the voltage from operations 401-402, respectively. Operation 403 may be performed, for example, by multiplier circuit 103, counter circuit 104, ADC circuit 113, subtractor circuit 114, and divider circuit 105 to generate an estimated inductance $L_{EST}$ of inductor 110, as described above with respect to FIG. 1. Operation 403 may alternatively be performed in part by the circuitry of FIG. 2 to generate an output SC, as described above.

In operation 404, a control parameter of the circuit system is modified using the estimated inductance of the inductor generated in operation 403. As an example, operation 404 may be performed by feedback parameter computation block 301 by adjusting the resistance and/or capacitance of a compensation network in a power converter circuit based on a change in the estimated inductance $L_{EST}$, as described above with respect to FIG. 3. As another example, operation 404 may be performed by failure detector block 303 to assert a failure signal FL if the estimated inductance $L_{EST}$ falls outside a predefined range of inductance values, as described above with respect to FIG. 3.

In operation 405, a current limit threshold of the circuit system is modified using the estimated inductance of the inductor generated in operation 403. As an example, operation 405 may be performed by current limit computation block 302. The current limit computation block 302 may adjust the current limit threshold of the power converter circuit based on a change in the estimated inductance $L_{EST}$, as described above with respect to FIG. 3.

After operation 405, the operations of FIG. 4 may end or may proceed to operation 406. In operation 406, the circuit system returns to operation 401 to update the calculation of the estimated inductance $L_{EST}$. For example, circuit system 100 of FIG. 1 may generate a new value for the estimated inductance $L_{EST}$ of inductor 110 in operations 401-403, then modify a control parameter using the new value of $L_{EST}$ in operation 404, and then adjust the current limit threshold based on the new value of $L_{EST}$ in operation 405. Operations 401-406 may be repeated iteratively by the circuit system.

The methods and apparatuses disclosed herein may be incorporated into any suitable electronic device or system of electronic devices. The methods and apparatuses may be used to power numerous types of integrated circuits, such as programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), microprocessors, and graphics processing units (GPUs).

The circuit systems and power converter circuits disclosed herein may be part of a data processing system that includes one or more of the following components; a processor; memory; input/output circuitry; and peripheral devices. The circuit systems and power converter circuits can be used in a wide variety of applications, such as computer networking, data networking, instrumentation, video processing, digital signal processing, or any other application.

Although the method operations were described in a specific order, it should be understood that other operations may be performed in between described operations, described operations may be adjusted so that they occur at different times or in a different order, or described operations may be distributed in a system that allows the occurrence of the processing operations at various intervals associated with the processing.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit system comprising:
a current sensor circuit that generates a current sense signal that indicates a current through an inductor;
a first subtractor circuit that determines a voltage difference across the inductor;
a multiplier circuit that multiplies the voltage difference by a time period that the voltage difference is applied across the inductor to generate a product;
an analog-to-digital converter circuit that outputs a maximum instantaneous current through the inductor and a minimum instantaneous current through the inductor based on the current sense signal;
a second subtractor circuit that subtracts the maximum instantaneous current through the inductor from the minimum instantaneous current through the inductor to generate a current difference; and
a divider circuit that divides the product by the current difference to generate an estimated inductance of the inductor.

2. The circuit system of claim 1 further comprising:
a counter circuit that generates the time period that the voltage difference is applied across the inductor in response to a pulse width modulation signal that is used to control switching of a switch in a power train circuit.

3. The circuit system of claim 1, wherein the circuit system comprises a power converter circuit, wherein the power converter circuit comprises a power train circuit, wherein the power train circuit comprises a switch circuit and the inductor, wherein the voltage difference is applied across the inductor during the time period when the switch circuit is conducting current, and wherein the current sense signal indicates a continuous current through the inductor.

4. The circuit system of claim 1, wherein the current sensor circuit comprises:
a sense element; and
an amplifier circuit that amplifies a voltage across the sense element to generate the current sense signal as a voltage replicated inductor current.

5. The circuit system of claim 1 further comprising:
a compensation network coupled to a feedback loop in a power converter circuit; and
a feedback parameter computation block that adjusts at least one of a resistance or a capacitance of the compensation network based on a change in the estimated inductance of the inductor.

6. The circuit system of claim 1 further comprising:
a current limit computation block that determines a current limit threshold that indicates a current overload condition for a power converter circuit based on the estimated inductance; and
a current limit circuit that compares the current limit threshold to a current through the inductor to determine when to turn off a switch in the power converter circuit to reduce the current through the inductor.

7. The circuit system of claim 1 further comprising:
a failure detector block that compares the estimated inductance of the inductor to a predefined range of inductance values,
wherein the failure detector block asserts a failure signal that causes one or more switches in a power train circuit to turn off if the failure detector block determines that the estimated inductance has fallen outside the predefined range of inductance values.

8. A circuit system comprising:
a current sensor circuit that generates a current sense signal that indicates a current through an inductor, wherein the circuit system generates a current value based on the current sense signal;
a subtractor circuit that determines a voltage difference across the inductor;
a multiplier circuit that multiplies the voltage difference by a time period that the voltage difference is applied across the inductor to generate a product;
a divider circuit that divides the product by the current value to generate an estimated inductance of the inductor;
a current limit computation block that determines a current limit threshold that indicates a current overload condition for a power converter circuit based on the estimated inductance; and
a current limit circuit that compares the current limit threshold to a current through the inductor to determine when to turn off a switch in the power converter circuit to reduce the current through the inductor,
wherein the current limit computation block adjusts the current limit threshold in response to a change in the estimated inductance of the inductor that is outside a predefined range of inductances of the inductor.

9. The circuit system of claim 8 further comprising:
a counter circuit that generates the time period that the voltage difference is applied across the inductor in response to a pulse width modulation signal that is used to control switching of a switch in a power train circuit.

10. The circuit system of claim 8, wherein the power converter circuit comprises a power train circuit, wherein the power train circuit comprises the switch and the inductor, wherein the voltage difference is applied across the inductor during the time period when the switch is conducting current, and wherein the current sense signal indicates a continuous current through the inductor.

11. The circuit system of claim 8 further comprising:
a compensation network coupled to a feedback loop in the power converter circuit; and
a feedback parameter computation block that adjusts at least one of a resistance or a capacitance of the compensation network based on a change in the estimated inductance of the inductor.

12. The circuit system of claim 8 further comprising:
a failure detector block that compares the estimated inductance of the inductor to a predefined range of inductance values,
wherein the failure detector block asserts a failure signal that causes the switch to turn off if the failure detector block determines that the estimated inductance has fallen outside the predefined range of inductance values.

13. A method comprising:
generating a current sense signal that indicates a current through an inductor using a current sensor circuit;
determining a voltage difference across the inductor using a first subtractor circuit;
multiplying the voltage difference by a time period that the voltage difference is applied across the inductor to generate a product using a multiplier circuit;
outputting a maximum instantaneous current through the inductor and a minimum instantaneous current through the inductor based on the current sense signal using an analog-to-digital converter circuit;
subtracting the maximum instantaneous current through the inductor from the minimum instantaneous current through the inductor to generate a current difference using a second subtractor circuit; and
dividing the product by the current difference to generate an estimated inductance of the inductor using a divider circuit.

14. The method of claim 13, wherein the inductor is in a power train circuit in a power converter circuit, wherein the power train circuit further comprises a switch circuit, and wherein the voltage difference is applied across the inductor during the time period when the switch circuit is conducting current.

15. The method of claim 13 further comprising:
adjusting at least one of a resistance or a capacitance of a compensation network in a feedback loop in a power converter circuit based on a change in the estimated inductance of the inductor.

16. The method of claim 13 further comprising:
comparing the estimated inductance of the inductor to a predefined range of inductance values using a failure detector block; and
asserting a failure signal that causes one or more switches in a power train circuit to turn off if the failure detector block determines that the estimated inductance has fallen outside the predefined range of inductance values.

17. A method comprising:
generating a current sense signal that indicates a current through an inductor using a current sensor circuit;
generating a current value based on the current sense signal;
determining a voltage difference across the inductor using a subtractor circuit;
multiplying the voltage difference by a time period that the voltage difference is applied across the inductor to generate a product using a multiplier circuit;
dividing the product by the current value to generate an estimated inductance of the inductor using a divider circuit;
adjusting a current limit threshold for a power converter circuit based on a change in the estimated inductance of the inductor that is outside a predefined range of inductances of the inductor using a current limit computation block; and
comparing the current limit threshold to a current through the inductor using a current limit circuit to determine when to cause a switch in the power converter circuit to turn off to reduce the current through the inductor.

18. The method of claim 17 further comprising:
adjusting at least one of a resistance or a capacitance of a compensation network in a feedback loop in the power converter circuit based on a change in the estimated inductance of the inductor.

19. The method of claim 17 further comprising:
comparing the estimated inductance of the inductor to a predefined range of inductance values using a failure detector block; and
asserting a failure signal that causes the switch to turn off if the failure detector block determines that the estimated inductance has fallen outside the predefined range of inductance values.

20. The method of claim 17, wherein the inductor is in a power train circuit in the power converter circuit, wherein the power train circuit further comprises the switch, and wherein the voltage difference is applied across the inductor during the time period when the switch is conducting current.

* * * * *